US012671402B2

(12) United States Patent
Ma et al.

(10) Patent No.: US 12,671,402 B2
(45) Date of Patent: Jun. 30, 2026

(54) DIGITAL PHASE INTERPOLATOR

(71) Applicant: MONTAGE ELECTRONICS (SHANGHAI) CO., LTD., Shanghai (CN)

(72) Inventors: Pingshun Ma, Shanghai (CN); Bo Qu, Shanghai (CN)

(73) Assignee: MONTAGE ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 18/968,228

(22) Filed: Dec. 4, 2024

(65) Prior Publication Data

US 2025/0192764 A1    Jun. 12, 2025

(30) Foreign Application Priority Data

Dec. 7, 2023    (CN) .......................... 202311678902.6

(51) Int. Cl.
 *H03K 5/131*        (2014.01)
 *H03K 5/00*         (2006.01)
(52) U.S. Cl.
 CPC ........................ *H03K 5/131* (2013.01); *H03K 2005/00058* (2013.01)

(58) Field of Classification Search
 None
 See application file for complete search history.

(56) References Cited

U.S. PATENT DOCUMENTS

| | | | | |
|---|---|---|---|---|
| 9,397,689 | B2 * | 7/2016 | Tertinek | H03K 5/13 |
| 9,793,884 | B2 * | 10/2017 | Ma | H03K 5/1565 |
| 11,086,353 | B2 * | 8/2021 | Huang | H03M 3/30 |
| 12,176,908 | B2 * | 12/2024 | Pike | H03L 7/0812 |

* cited by examiner

*Primary Examiner* — Cassandra F Cox
(74) *Attorney, Agent, or Firm* — Oliff PLC

(57)    ABSTRACT

A digital phase interpolator includes: first and second phase interpolating units, first and second auxiliary interpolating units, and a buffer unit. The first auxiliary interpolating unit is connected with the first phase interpolating unit between a first input signal and an input end of the buffer unit. The second auxiliary interpolating unit is connected with the second phase interpolating unit between a second input signal and the input end of the buffer unit, and there is a preset phase difference between the first input signal and the second input signal. An output end of the buffer unit is an output end of the digital phase interpolator. Both the first and second phase interpolating units have N basic interpolating units connected in parallel, and weights of the first and second auxiliary interpolating units are both half of the weight of the basic interpolating unit, wherein N is greater than 1.

12 Claims, 4 Drawing Sheets

DIGITAL PHASE INTERPOLATOR

CROSS-REFERENCE TO PRIOR APPLICATION

The present application claims priority to Chinese Application No. 202311678902.6 filed on Dec. 7, 2023, which is incorporated herein by reference in its entirety.

TECHNICAL FIELD

The present application relates to the field of integrated circuit design, in particular to a digital phase interpolator.

BACKGROUND

The phase adjustment of signals is usually achieved through phase interpolation (PI). A traditional N-bit digital phase interpolator (where N is greater than 1) generally uses N basic interpolating units connected directly for interpolation. Its principle is mainly to change the weight of the input clock in order to achieve the goal of changing the output phase. In scenarios where high-bit digital phase interpolation is needed, as the number of interpolation bits increases, the number of basic interpolating units multiplies, resulting in a significant increase in the power consumption and area of the phase interpolator.

FIG. 1 is a schematic circuit diagram of a traditional 16-bit digital phase interpolator. As shown in FIG. 1, a first input signal is In_a and a second input signal is In_b, which are respectively connected to 16 basic interpolating units connected in parallel. Each basic interpolating unit includes an inverter and a switch connected in series with the inverter. The turn-on/off of each switch are controlled by a 1-bit control code.

FIG. 2 shows an interpolation result (Out) output by the traditional 16-bit digital phase interpolator of FIG. 1. From FIG. 1, it can be seen that in the traditional 16-bit digital phase interpolator, 32 basic interpolating units are needed for the input signals In_a and In_b, resulting in high circuit power consumption and large area occupation.

Therefore, it is necessary to further improve the existing digital phase interpolator.

SUMMARY OF THE INVENTION

An object of the present application is to provide a digital phase interpolator that significantly reduces the power consumption and area of the digital phase interpolator.

An embodiment of the present application discloses a digital phase interpolator, comprising:

a first phase interpolating unit, a second phase interpolating unit, a first auxiliary interpolating unit, a second auxiliary interpolating unit, and a buffer unit;

the first auxiliary interpolating unit is connected in parallel with the first phase interpolating unit between a first input signal and an input end of the buffer unit;

the second auxiliary interpolating unit is connected in parallel with the second phase interpolating unit between a second input signal and the input end of the buffer unit, and there is a preset phase difference between the first input signal and the second input signal;

an output end of the buffer unit is an output end of the digital phase interpolator;

wherein, the first phase interpolating unit and the second phase interpolating unit both comprise N basic interpolating units connected in parallel, and the weights of the first auxiliary interpolating unit and the second auxiliary interpolating unit are both half of the weight of the basic interpolating unit, wherein N is an integer greater than 1.

In another preferred embodiment, the first auxiliary interpolating unit and the second auxiliary interpolating unit are controlled by a same control signal, so that the first auxiliary interpolating unit and the second auxiliary interpolating unit are simultaneously turned on or turned off.

In another preferred example, the basic interpolating unit comprises a first inverter.

In another preferred embodiment, the basic interpolating unit further comprises a first switch, and the first inverter is connected in series with the first switch.

In another preferred embodiment, the first auxiliary interpolating unit and the second auxiliary interpolating unit both comprise a second inverter.

In another preferred embodiment, the first auxiliary interpolating unit and the second auxiliary interpolating unit further comprise a second switch, and the second inverter is connected in series with the second switch.

In another preferred example, the buffer unit comprises a third inverter.

In another preferred embodiment, the first phase interpolating unit is controlled by a first control signal, the second phase interpolating unit is controlled by a second control signal, and the second control signal is an inverted signal of the first control signal.

In another preferred example, the first control signal and the second control signal are both N-bit thermometer codes.

In another preferred embodiment, the first control signal and the second control signal are obtained by a decoding unit translating (decoding) a binary code input to the digital phase interpolator.

In another preferred embodiment, by the decoding unit, the binary code is translated (decoded) into two N-bit thermometer codes pe and po, and one thermometer code is selected from the two N-bit thermometer codes pe and po as the first control signal based on the least significant bit of the binary code, and the inverse code of the selected thermometer code is used as the second control signal; wherein, pe=po+1.

In another preferred example, the first auxiliary interpolating unit and the second auxiliary interpolating unit are both controlled by the least significant bit of the binary code.

A large number of technical features are described in the specification of the present application, and are distributed in various technical solutions. If a combination (i.e., a technical solution) of all possible technical features of the present application is listed, the specification will be too lengthy. In order to avoid this problem, the various technical features disclosed in the above summary of the present application, the various technical features disclosed in the following embodiments and examples, and the various technical features disclosed in the accompanying drawings can be freely combined with each other to form various new technical solutions (all of which are deemed to have been recorded in this specification), unless such combinations of technical features are technically unfeasible. For example, features A+B+C are disclosed in one example, and features A+B+D+E are disclosed in another example, while features C and D are equivalent technical means that perform the same function, and technically only choose one, not to adopt at the same time. Feature E can be combined with feature C technically. Then, the solution of A+B+C+D should not be considered as already recorded due to technical infeasibility, while the solution of A+B+C+E should be considered as already recorded.

DETAILED DESCRIPTION

In the following description, many technical details are presented to help readers better understand the present application. However, those skilled in the art can understand that the technical solutions claimed by the claims of the present application can still be implemented even without these technical details and various changes and modifications based on the following embodiments.

In order to make the objects, technical solutions and advantages of the present application more clear, embodiments of the present application will be further described in detail below with reference to the accompanying drawings.

Figure 3:
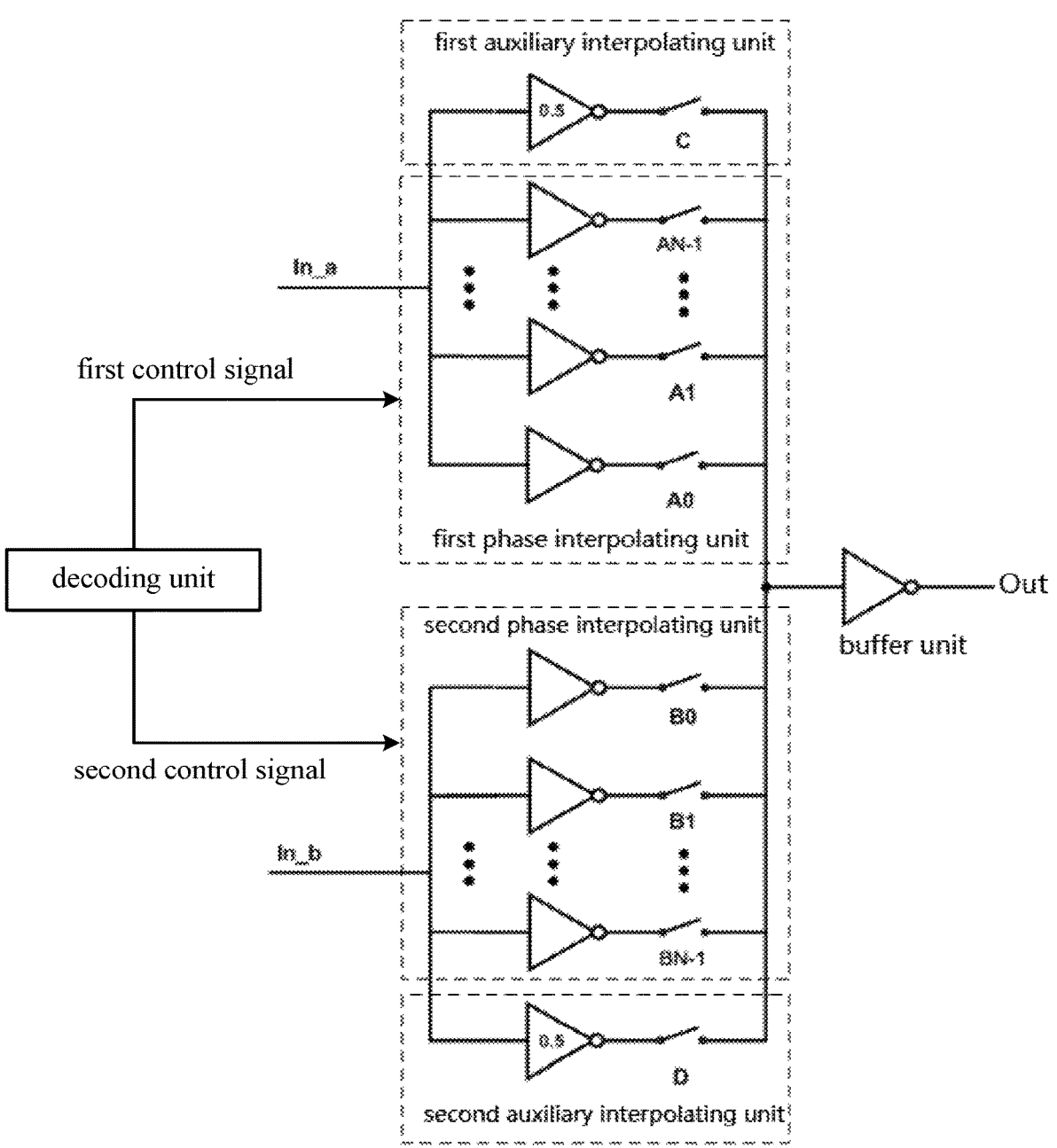
FIG. 3 is a schematic circuit diagram of a digital phase interpolator according to an embodiment of the present application.

An embodiment of the present application relates to a digital phase interpolator. FIG. 3 is a schematic circuit diagram of the digital phase interpolator.

Specifically, as shown in FIG. 3, the digital phase interpolator comprises: a first phase interpolating unit, a second phase interpolating unit, a first auxiliary interpolating unit, a second auxiliary interpolating unit, and a buffer unit. An input end of the first phase interpolating unit is used to receive a first input signal In_a, and an output end of the first phase interpolating unit is connected to an input end of the buffer unit. An input end of the second phase interpolating unit is used to receive a second input signal In_b, and an output end of the second phase interpolating unit is connected to the input end of the buffer unit; wherein, there is a preset phase difference between the first input signal In_a and the second input signal In_b. The first auxiliary interpolating unit is connected in parallel with the first phase interpolating unit. The second auxiliary interpolating unit is connected in parallel with the second phase interpolating unit. An output end of the buffer unit is an output end (Out) of the digital phase interpolator. Wherein, the first phase interpolating unit have the same structures with the second phase interpolating unit, both including N basic interpolating units connected in parallel, wherein N is an integer greater than 1. The first auxiliary interpolating unit has the same structures as the second auxiliary interpolating unit, and weights of the first auxiliary interpolating unit and the second auxiliary interpolating unit may be equal, for example, both being half (½) of the weight of the basic interpolating unit.

In some embodiments, the first auxiliary interpolating unit and the second auxiliary interpolating unit are controlled by a same control signal, so that the first auxiliary interpolating unit and the second auxiliary interpolating unit are simultaneously turned on or turned off.

In some embodiments, each basic interpolating unit may include a first inverter, and the switching in and switching out of the basic interpolating unit can be controlled by controlling the turn-on and turn-off of the first inverter. In other embodiments, each basic interpolating unit may include a first inverter and a first switch. The first inverter is connected in series with the first switch, and the switching in and switching out of the basic interpolating unit can be controlled by the first switch.

In some embodiments, the first auxiliary interpolating unit and the second auxiliary interpolating unit both include a second inverter, and the switching in and switching out of the first auxiliary interpolating unit and the switching in and switching out of the second auxiliary interpolating unit can be controlled by controlling the turn-on and turn-off of the corresponding second inverter. In other embodiments, the first auxiliary interpolating unit and the second auxiliary interpolating unit both include a second inverter and a second switch. The second inverter is connected in series with the second switch, and the switching in and switching out of the first auxiliary interpolating unit and the switching in and switching out of the second auxiliary interpolating unit can be controlled by the corresponding second switch.

In some embodiments, the weights of the first auxiliary interpolating unit and the second auxiliary interpolating unit are both half of the weight of the basic interpolating unit, that is, a size of the second inverter may be approximately half of a size of the first inverter.

FIG. 3 illustrates an example where one switch is connected between an output end of each inverter and the input end of the buffer unit, wherein the turn-on and turn-off of each switch are controlled by a 1-bit control code of the control signal. As shown in FIG. 3, an output end of each first inverter in the first phase interpolating unit is connected to one of the first switches, namely switch A0, switch A1, . . . , switch AN-1. An output end of each first inverter in the second phase interpolating unit is also connected to one of the first switches, namely switch B0, switch B1, . . . , switch BN-1. An output end of the second inverter in the first auxiliary interpolating unit is connected to the second switch, namely switch C, and an output end of the second inverter in the second auxiliary interpolating unit is connected to the second switch, namely switch D. A number 0.5 marked on the second inverter in the first auxiliary interpolating unit and the second inverter in the second auxiliary interpolating unit indicates that the weights of the first interpolating unit and the second auxiliary interpolating unit are both half of the weight of the basic interpolating unit.

Each of the first switches (switches A0 to AN-1) in the first phase interpolating unit can be controlled by a first control signal, and each of the first switches (switches B0 to BN-1) in the second phase interpolating unit can be controlled by a second control signal, and the second control signal is an inverted signal of the first control signal. In some embodiments, the first control signal and the second control signal are respectively N-bit thermometer codes, where each bit of the N-bit thermometer code is used to control one of the first switches, and these two N-bit thermometer codes are inverse to each other.

The second switch in the first auxiliary interpolating unit and the second switch in the second auxiliary interpolating unit are both controlled by a third control signal, that is, the first auxiliary interpolating unit and the second auxiliary interpolating unit are simultaneously switched in or out. Taking the control signals input into the digital phase interpolator as a binary code as an example, the determinations of the first control signal, the second control signal, and the third control signal are illustrated. The digital phase interpolator may include a decoding unit that receives the binary code input to the digital phase interpolator and translates it into two N-bit thermometer codes, pe and po, wherein pe=po+1. Then the decoding unit selects one thermometer code from the thermometer codes pe and po as the first control signal based on the least significant bit (LSB) of the binary code, and uses the inverse code of the selected thermometer code as the second control signal. For example, when LSB of the binary code is 0, the thermometer code po is selected as the first control signal, and the inverse code of the thermometer code po is used as the second control signal; When LSB=1, the thermometer code pe is selected as the first control signal, and the inverse code of the thermometer code pe is used as the second control signal. The third control signal can be determined by the least significant bit of the binary code, for example, the third control signal is the least significant bit of the binary code. In some embodiments, the binary code can be an (n+1)-bit binary code, wherein $N=2^n$ and n is an integer greater than or equal to 1.

In some embodiments, the buffer unit includes a third inverter.

It should be noted that in the various embodiments of the present application, the buffer unit can be composed of an inverter or a NAND gate. The buffer unit only needs to provide driving capability, and its specific structural composition is not limited here.

Figure 4:
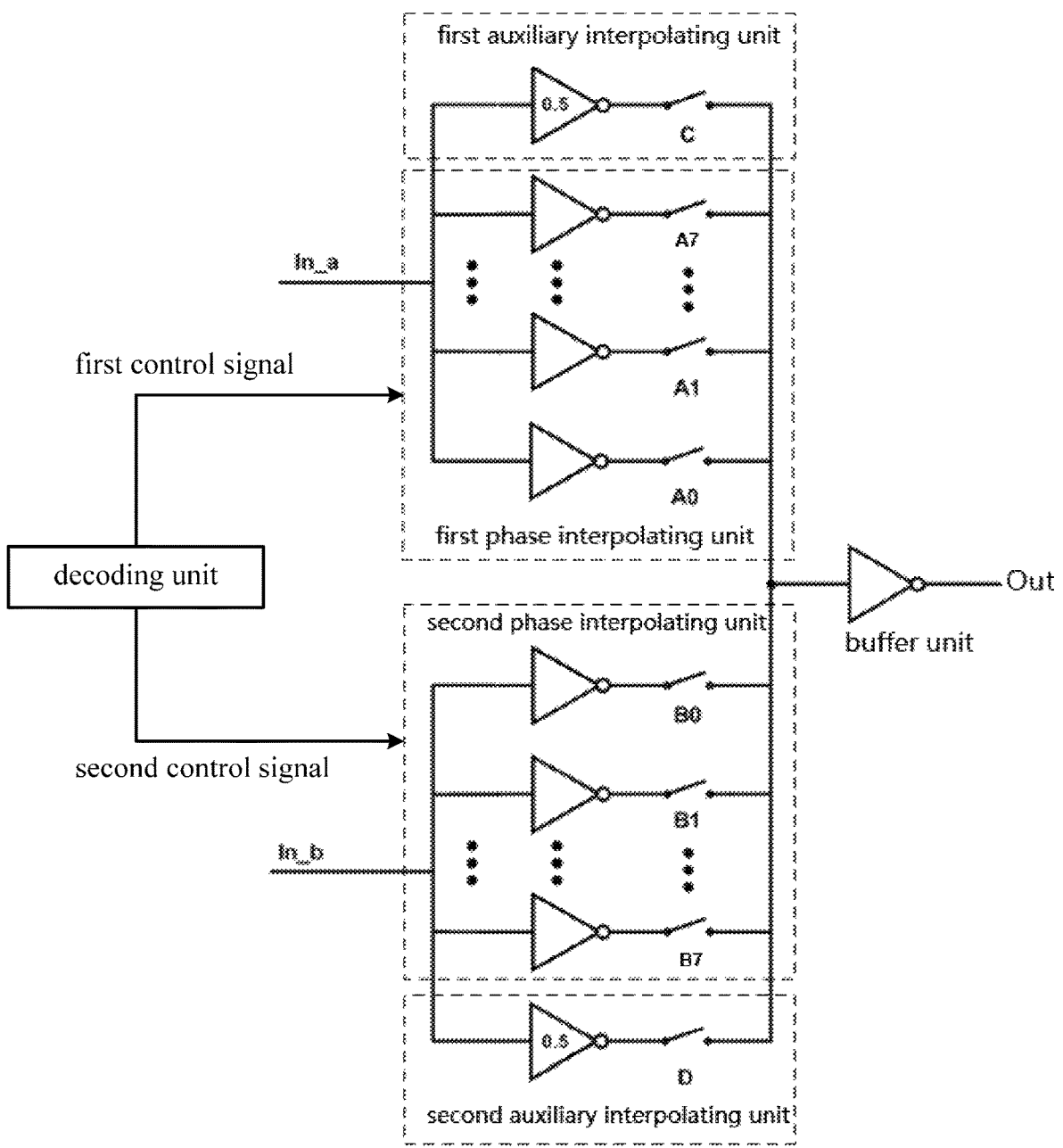
FIG. 4 is a schematic circuit diagram of a 16-bit digital phase interpolator according to an embodiment of the present application.

FIG. 4 is a schematic circuit diagram showing a 16-bit digital phase interpolator. As shown in FIG. 4, the first input signal In_a is input to the first phase interpolating unit, and the second input signal In_b is input to the second phase interpolating unit. The first auxiliary interpolating unit is connected in parallel between the input and output ends of the first phase interpolating unit, and the second auxiliary interpolating unit is connected in parallel between the input and output ends of the second phase interpolating unit. The output ends of the first and second phase interpolating units are connected to the buffer unit, and interpolation results are output via the buffer unit.

The first phase interpolating unit includes 8 basic interpolating units connected in parallel, and the second phase interpolating unit includes 8 basic interpolating units connected in parallel. Each basic interpolating unit includes a first inverter and a first switch connected in series with the first inverter, and the first and second auxiliary interpolating units both include a second inverter and a second switch connected in series with the second inverter. The switches A0-A7 and B0-B7 in the first and second phase interpolating units can be controlled by two 8-bit thermometer codes, respectively. The weights of the first auxiliary interpolating unit and the second auxiliary interpolating unit are both half of the weight of the basic interpolating unit. For example, when the weight of the basic interpolating unit is 1, the weights of the first and second auxiliary interpolating units are 0.5.

Figure 1:
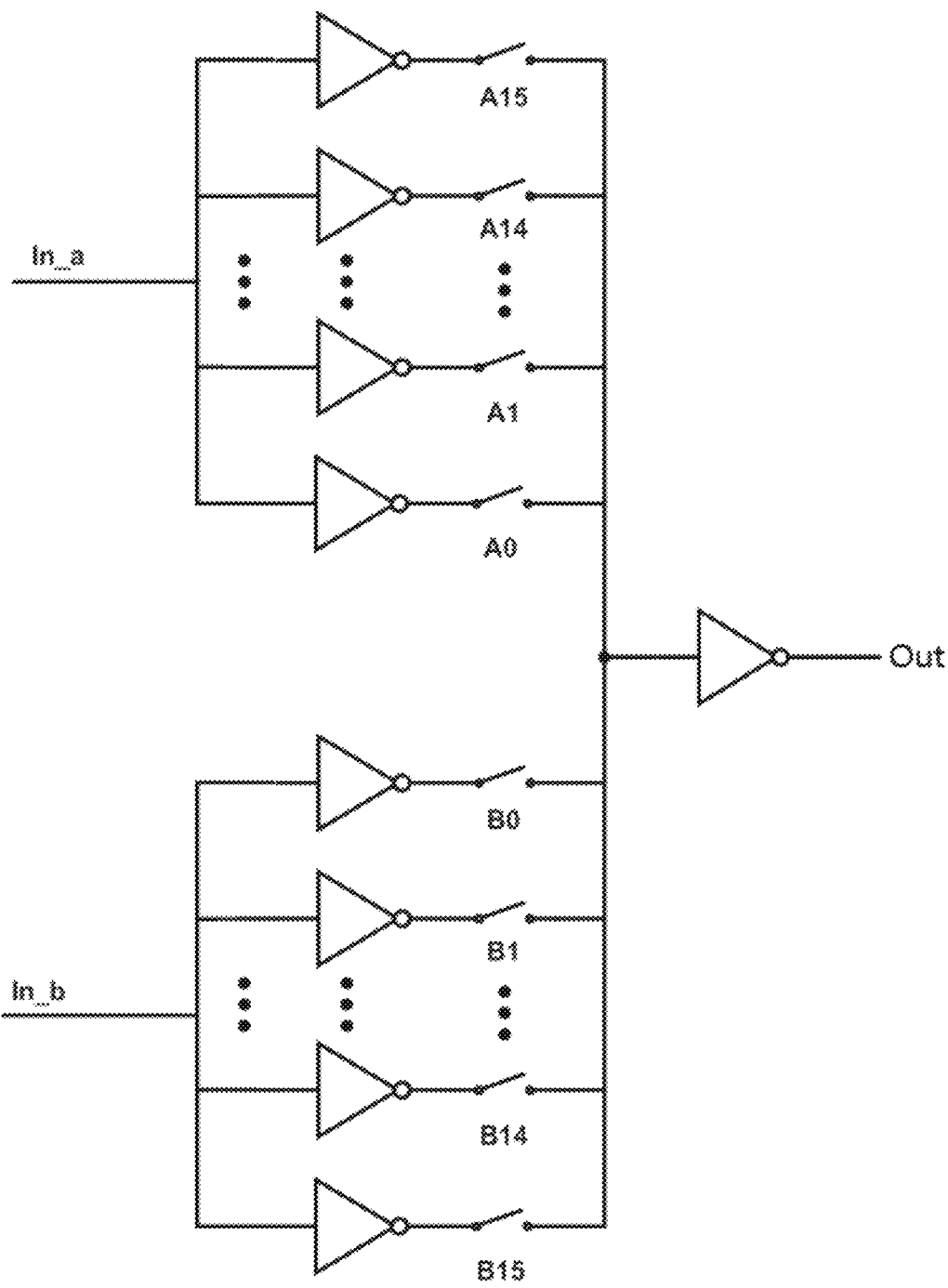
FIG. 1 is a schematic circuit diagram of a traditional 16-bit digital phase interpolator.

It should be noted that in various embodiments of the present application, as shown in FIGS. 1, 3, and 4, a side of the circuit where the first phase interpolating unit and the first auxiliary interpolating unit are located is one of the "two sides" mentioned above, and a side of the circuit where the second phase interpolating unit and the second auxiliary interpolating unit are located is the other side of the "two sides" mentioned above.

Assuming that the control signal input to the digital phase interpolator shown in FIG. 4 is a 4-bit binary code, it is necessary to first translate the 4-bit binary code into two 8-bit thermometer codes, pe and po. Then, based on the least significant bit of the 4-bit binary code, a thermometer code from pe and po is selected to control switches A0-A7, and the inverse code of the selected thermometer code is used to control switches B0-B7. Simultaneously, the least significant bit of the 4-bit binary code is used to control switches C and D in two auxiliary interpolating units.

The encoding method of the 16-bit digital phase interpolator shown in FIG. 4 will be illustrated below as an example.

For example, when the input control signal is a 4-bit binary code "0000", the 4-bit binary code "0000" can be translated first to obtain two 8-bit thermometer codes pe and po. Then, based on the least significant bit of the binary code "0000", one of the thermometer codes pe and po is selected as the first control signal. Here, the least significant bit is 0, po can be selected as the first control signal, and the inverse code of po can be selected as the second control signal. The specific translation method has been explained in the above text and will not be repeated here. After translation processing, 8-bit first control signal for controlling the 8 switches A0-A7 of the first phase interpolating unit is "11111111", while 8-bit second control signal for controlling the 8 switches B0-B7 of the second phase interpolating unit is "00000000". Because the least significant bit of the 4-bit binary code "0000" is 0, the control codes for the switch C of the first auxiliary interpolating unit and the switch D of the second auxiliary interpolating unit are both "0". Obviously, the "1" and "0" in the control signals or control codes are two opposite control commands. For example, when "1" indicates "turning on" a corresponding switch, "0" indicates "turning off" the corresponding switch.

When the input control signal is a 4-bit binary code "0001", the first control signal is "11111110" and the second control signal is "00000001". Because the least significant bit of the 4-bit binary code "0001" is 1, the control codes for switch C of the first auxiliary interpolating unit and switch D of the second auxiliary interpolating unit are both "1".

When the input control signal is a 4-bit binary code "0010", the first control signal is "11111110" and the second control signal is "00000001". Because the least significant bit of the 4-bit binary code "0010" is 0, the control codes for switch C of the first auxiliary interpolating unit and switch D of the second auxiliary interpolating unit are both "0".

When the input control signal is a 4-bit binary code "0011", the first control signal is "11111100" and the second control signal is "00000011". Because the least significant bit of the 4-bit binary code "0011" is 1, the control codes for switch C of the first auxiliary interpolating unit and switch D of the second auxiliary interpolating unit are both "1".

Table 1 shows switch control codes corresponding to interpolation results output by the 16-bit digital phase interpolator shown in FIG. 4, and the binary codes of the control signals input to the digital phase interpolator

| Output result (Out) | A0-A7, C | B0-B7, D | Control signal (Input code <3:0>) |
|---|---|---|---|
| 0 | 111111110 | 000000000 | 0000 |
| 1 | 111111101 | 000000001 | 0001 |
| 2 | 111111100 | 000000010 | 0010 |
| 3 | 111111001 | 000000011 | 0011 |
| 4 | 111111000 | 000000110 | 0100 |
| 5 | 111110001 | 000000111 | 0101 |
| 6 | 111110000 | 000001110 | 0110 |
| 7 | 111100001 | 000001111 | 0111 |
| 8 | 111100000 | 000011110 | 1000 |
| 9 | 111000001 | 000011111 | 1001 |
| 10 | 111000000 | 000111110 | 1010 |
| 11 | 110000001 | 000111111 | 1011 |
| 12 | 110000000 | 001111110 | 1100 |

-continued

| Output result (Out) | A0-A7, C | B0-B7, D | Control signal (Input code <3:0>) |
|---|---|---|---|
| 13 | 100000001 | 001111111 | 1101 |
| 14 | 100000000 | 011111110 | 1110 |
| 15 | 000000001 | 011111111 | 1111 |

Figure 2:
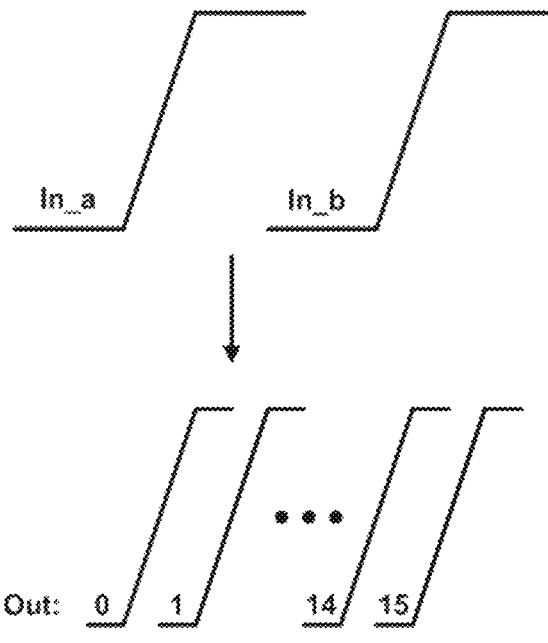
FIG. 2 is a schematic diagram of the interpolation result output by a traditional 16-bit digital phase interpolator.

By using the above control signal encoding method, the 16-bit digital phase interpolator shown in FIG. 4 can achieve the same interpolation effect as FIG. 2. Moreover, compared with the traditional 16-bit digital phase interpolator that requires 32 basic interpolating units connected in parallel, the solution proposed in the present application only requires 16 basic interpolating units and 2 auxiliary interpolating units to achieve the interpolation effect of the 16-bit digital phase interpolator, greatly reducing power consumption and area.

The digital phase interpolator disclosed in this application is capable of performing 2×N-bit interpolation on two input signals with a preset phase difference to form a 2N-bit digital phase interpolator by connecting an auxiliary interpolating unit in parallel on each side of a N-bit digital phase interpolator. Compared with a traditional 2×N-bit digital phase interpolator, it significantly reduces power consumption and area, and the load on the signal input end is also lower.

It should be noted that the various circuit components mentioned in the embodiments of the present application are all logic modules. Physically, a logic module can be a physical module, a part of a physical module, or a combination of multiple physical modules. The physical implementing methods of these logic modules themselves are not the most important, and the combination of the functions implemented by these logic modules is the key to solving the technical problems proposed in the present application. In addition, in order to highlight the innovative part of the present application, the above-mentioned circuit or device embodiments of the present application have not introduced modules that are not closely related to solving the technical problems proposed in the present application, which does not indicate that there are no other modules in the above-mentioned circuit or device embodiments.

It should be noted that in the claims and specification of the present patent, relationship terms such as first and second etc. are just used to distinguish one entity or operation from another, and do not necessarily require or indicate any actual relationship or sequence existing between these entities or operations. Moreover, the terms "include", "comprise" or any other variation thereof are intended to encompass non-exclusive inclusion, such that a process, method, item or device that comprises a series of elements not only includes those elements, but also includes other elements that are not explicitly listed, or also includes elements inherent to such process, method, item or device. Without further limitations, the element defined by the phrase "include one" does not exclude another identical element existing in the process, method, item or device that includes the element.

By referring to some preferred embodiments of the present application, the present application has been illustrated and described. But it should be understood to those skilled in the art that various changes can be made in form and details without departing from the spirit and scope of the present application.

What is claimed is:

1. A digital phase interpolator, comprising:
   a first phase interpolating unit, a second phase interpolating unit, a first auxiliary interpolating unit, a second auxiliary interpolating unit, and a buffer unit;
   the first auxiliary interpolating unit is connected in parallel with the first phase interpolating unit between a first input signal and an input end of the buffer unit;
   the second auxiliary interpolating unit is connected in parallel with the second phase interpolating unit between a second input signal and the input end of the buffer unit, and there is a preset phase difference between the first input signal and the second input signal;
   an output end of the buffer unit is an output end of the digital phase interpolator;
   wherein, the first phase interpolating unit and the second phase interpolating unit both comprise N basic interpolating units connected in parallel, and weights of the first auxiliary interpolating unit and the second auxiliary interpolating unit are both half of the weight of the basic interpolating unit, wherein N is an integer greater than 1.

2. The digital phase interpolator according to claim 1, wherein the first auxiliary interpolating unit and the second auxiliary interpolating unit are controlled by a same control signal, so that the first auxiliary interpolating unit and the second auxiliary interpolating unit are simultaneously turned on or turned off.

3. The digital phase interpolator according to claim 1, wherein the basic interpolating unit comprises a first inverter.

4. The digital phase interpolator according to claim 3, wherein the basic interpolating unit further comprises a first switch, and the first inverter is connected in series with the first switch.

5. The digital phase interpolator according to claim 3, wherein both the first auxiliary interpolating unit and the second auxiliary interpolating unit comprise a second inverter.

6. The digital phase interpolator according to claim 5, wherein the first auxiliary interpolating unit and the second auxiliary interpolating unit further comprise a second switch, and the second inverter is connected in series with the second switch.

7. The digital phase interpolator according to claim 1, wherein the buffer unit comprises a third inverter.

8. The digital phase interpolator according to claim 1, wherein the first phase interpolating unit is controlled by a first control signal, the second phase interpolating unit is controlled by a second control signal, and the second control signal is an inverted signal of the first control signal.

9. The digital phase interpolator according to claim 8, wherein the first control signal and the second control signal are both N-bit thermometer codes.

10. The digital phase interpolator according to claim 9, wherein the first control signal and the second control signal are obtained by a decoding unit translating a binary code input to the digital phase interpolator.

11. The digital phase interpolator according to claim 10, wherein by the decoding unit, the binary code is translated into two N-bit thermometer codes pe and po, and one thermometer code is selected from the two N-bit thermometer codes pe and po as the first control signal based on the least significant bit of the binary code, and the inverse code of the selected thermometer code is used as the second control signal; wherein, pe=po+1.

12. The digital phase interpolator according to claim 10, wherein the first auxiliary interpolating unit and the second auxiliary interpolating unit are both controlled by the least significant bit of the binary code.

\* \* \* \* \*